US008671379B1

(12) United States Patent
Jain et al.

(10) Patent No.: US 8,671,379 B1
(45) Date of Patent: Mar. 11, 2014

(54) MULTI-THREADED DETERMINISTIC ROUTER

(71) Applicant: Xilinx, Inc., San Jose, CA (US)

(72) Inventors: Jitu Jain, Los Gatos, CA (US); Vinay Verma, Fremont, CA (US); Taneem Ahmed, Toronto (CA); Sandor S. Kalman, Santa Clara, CA (US); Sanjeev Kwatra, Cupertino, CA (US); Christopher H. Kingsley, Longmont, CO (US); Jason H. Anderson, Toronto (CA); Satyaki Das, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/656,628

(22) Filed: Oct. 19, 2012

Related U.S. Application Data

(62) Division of application No. 12/718,945, filed on Mar. 5, 2010, now Pat. No. 8,312,409.

(51) Int. Cl.
*G06F 17/50* (2006.01)

(52) U.S. Cl.
USPC .......... 716/126; 716/128; 716/129; 716/130; 716/139

(58) Field of Classification Search
USPC ......................... 716/121–131, 139
See application file for complete search history.

(56) References Cited

U.S. PATENT DOCUMENTS

| 5,361,214 | A | | 11/1994 | Aoki | |
| 5,717,600 | A | * | 2/1998 | Ishizuka | 716/130 |
| 7,134,112 | B1 | * | 11/2006 | Anderson et al. | 716/113 |
| 7,707,536 | B2 | | 4/2010 | Lin et al. | |
| 8,122,420 | B1 | * | 2/2012 | Kannan et al. | 716/128 |
| 8,312,409 | B1 | * | 11/2012 | Jain et al. | 716/131 |
| 2011/0055784 | A1 | | 3/2011 | Gao et al. | |
| 2011/0055789 | A1 | | 3/2011 | Chakanaker et al. | |
| 2011/0055790 | A1 | | 3/2011 | Gao | |

OTHER PUBLICATIONS

U.S. Appl. No. 12/718,945, filed Mar. 5, 2010, Jain, Gitu, et al., Xilinx, Inc., San Jose, CA USA.
Chan, Pak K. and Schlag, Martine, D.F., University of California, "Acceleration of an FPGA Router" $5^{th}$ IEEE Symposium on FPGA-Based Custom Computing Machines (FCCM'97), Apr. 16-18, 1997, pp. 175-181, Napa Valley, California 95064, USA.
Cong, et al., Dune: A multi-Layer Gridless Routing System, IEEE 2001, pp. 1-6.
McMurchie, L. and Ebeling,C., "Pathfinder: A negotiation-based performance driven router for FPGAS," Proceedings of $3^{rd}$ International ACM Symposium on FPGA's (FPGA'95), Feb. 1995, pp. 111-117, Monterey, California, USA.

* cited by examiner

*Primary Examiner* — Nghia Doan
(74) *Attorney, Agent, or Firm* — Kevin T. Cuenot

(57) ABSTRACT

Within a system comprising a plurality of processors and a memory, a method of determining routing information for a circuit design for implementation within a programmable integrated circuit can include determining that nets of the circuit design comprise overlap and unrouting nets comprising overlap. A congestion picture can be determined that comprises costs of routing resources for the integrated circuit wherein the cost of a routing resource comprises a measure of historical congestion and a measure of current congestion, and wherein unrouted nets do not contribute to the measures of current congestion in the congestion picture. The method further can include concurrently routing a plurality of the unrouted nets via the plurality of processors executing in parallel according to the congestion picture and storing routing information for nets of the circuit design in the memory.

6 Claims, 6 Drawing Sheets

MULTI-THREADED DETERMINISTIC ROUTER

FIELD OF THE INVENTION

One or more embodiments disclosed within this specification relate to integrated circuit (IC) devices. More particularly, one or more embodiments relate to a multi-threaded deterministic router for routing nets of a circuit design to be implemented within an IC device.

BACKGROUND

Programmable integrated circuit (IC) devices are a well-known type of IC that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated block random access memories (BRAMs), multipliers, digital signal processing blocks (DSPs), processors, clock managers, delay lock loops (DLLs), and so forth.

Each programmable tile typically includes both programmable interconnect and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect and programmable logic circuits are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is stored on-chip in non-volatile memory. In other CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

A circuit design, in general, is implemented within a programmable IC by performing an implementation flow comprising a plurality of tasks. An electronic design automation (EDA) tool or tools, as the case may be, performs the implementation flow. In general, the tasks performed during an implementation flow by the EDA tool include synthesis, mapping, placement, and routing. Performing the implementation flow allows the circuit design to be implemented within a particular programmable IC referred to as the target programmable IC.

Synthesis generally refers to the process of converting a hardware description language (HDL) description of a circuit design into a gate level description of the circuit design. The circuit design can be "compiled" using a logic synthesis tool into an implementation of low level logic gates. Mapping generally refers to the process of identifying constructs of the logical netlist, e.g., primitive logic gates, and associating those constructs with the physical resources of the target programmable IC that can implement the constructs. For example, one or more individual logic gates may be mapped to look-up tables (LUTs), latches, flip-flops, BRAMs, or the like.

Placement generally refers to the process of assigning the types of physical resources, to which constructs of the synthesized circuit design have been mapped, to actual locations on the target programmable IC. For example, once logic gates are assigned to LUTs for implementation, combinations of logic gates can be assigned to a particular LUT on the target programmable IC, where that LUT has a particular, physical location on the target programmable IC.

Routing a circuit design refers to the process of programming the interconnect circuitry to establish the necessary signaling links among the various physical resources, e.g., circuit elements of the target programmable IC. Routing can be a complicated process due to the large number of nets that must be processed, the large number of PIPs, and the necessity of avoiding conflicting assignments of nets to PIPs, all while trying to meet design goals relating to performance and power consumption. Despite much research in this field, routing a circuit design still can take a significant amount of time.

The advent of multi-processor computing systems provides the opportunity to perform tasks in parallel, thereby facilitating more efficient and faster operation of EDA tools than on single processor systems. To take advantage of the parallelism of multi-processor systems and reduce runtimes, EDA tools often must be redesigned. Conventional techniques for performing tasks such as routing, for example, when applied to multi-processor computing systems may be non-deterministic. More particularly, the EDA tool, in many cases, is unable to reliably reproduce a given solution to a particular problem. Thus, each time the EDA tool is run on a given circuit design, a different routing result may be generated. This non-determinism within the EDA tool makes supporting commercial users difficult since prior results cannot be reliably reproduced.

SUMMARY

One or more embodiments disclosed within this specification relate to integrated circuit (IC) devices and, more particularly, to a multi-threaded, deterministic router for routing nets of a circuit design to be implemented within an IC device. One embodiment can include a method of determining routing information for a circuit design for implementation within a programmable IC that can be implemented within a system comprising a plurality of processors and a memory. The method can include determining that nets of the circuit design include overlap, unrouting the nets of the circuit design comprising overlap, and determining a congestion picture comprising costs of routing resources for the programmable IC. The cost of a routing resource can include a measure of historical congestion and a measure of current congestion. Unrouted nets do not contribute to the measures of current congestion in the congestion picture. The method further can include concurrently routing a plurality of the unrouted nets, via the plurality of processors executing in parallel, according to the congestion picture, and also can include storing routing information specifying routes for nets of the circuit design in the memory.

Another embodiment can include a non-transitory computer-readable medium having instructions which when executed on a computer perform a method comprising: determining that nets of the circuit design comprise overlap; unrouting the nets of the circuit design comprising overlap; determining a congestion picture comprising costs of routing resources for the programmable integrated circuit, wherein the cost of a routing resource comprises a measure of historical congestion and a measure of current congestion, and wherein unrouted nets do not contribute to the measures of current congestion in the congestion picture; concurrently routing a plurality of the unrouted nets, via the plurality of processors executing in parallel, according to the congestion picture; and storing routing information specifying routes for nets of the circuit design in the memory.

DESCRIPTION OF THE DRAWINGS

While the specification concludes with claims defining features of one or more embodiments of the invention that are regarded as novel, it is believed that one or more embodiments of the invention will be better understood from a consideration of the description in conjunction with the drawings. As required, one or more detailed embodiments of the present invention are disclosed herein; however, it is to be understood that the disclosed embodiments are merely exemplary of the inventive arrangements, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of one or more embodiments of the invention.

One or more embodiments disclosed within this specification relate to integrated circuit (IC) devices. More particularly, one or more embodiments relate to an electronic design automation (EDA) tool configured to operate within a multi-threaded processing system. In accordance with the inventive arrangements disclosed herein, the EDA tool can include a multi-threaded, deterministic router for routing nets of a circuit design. Thus, given a particular input, e.g., a circuit design, the EDA tool can reliably generate a same output, e.g., a routed version of the circuit design. The EDA tool can manage thread execution while performing overlap removal to ensure a deterministic result.

In general, an initial route of the circuit design can be performed. Those nets with overlap can be ripped up, e.g., unrouted, and re-routed. In one aspect, the unrouted nets can be re-routed in parallel by a plurality of processors. A congestion picture, which reflects the different costs of using routing resources of a programmable IC within which the circuit design is to be implemented (referred to as the "target programmable IC"), is updated as described in further detail within this specification. By controlling the manner in which the congestion picture is updated and used by the different parallel executing processors and the distribution of nets among the processors, the EDA tool can route the circuit design for implementation within the target programmable IC in a deterministic manner.

Figure 1:
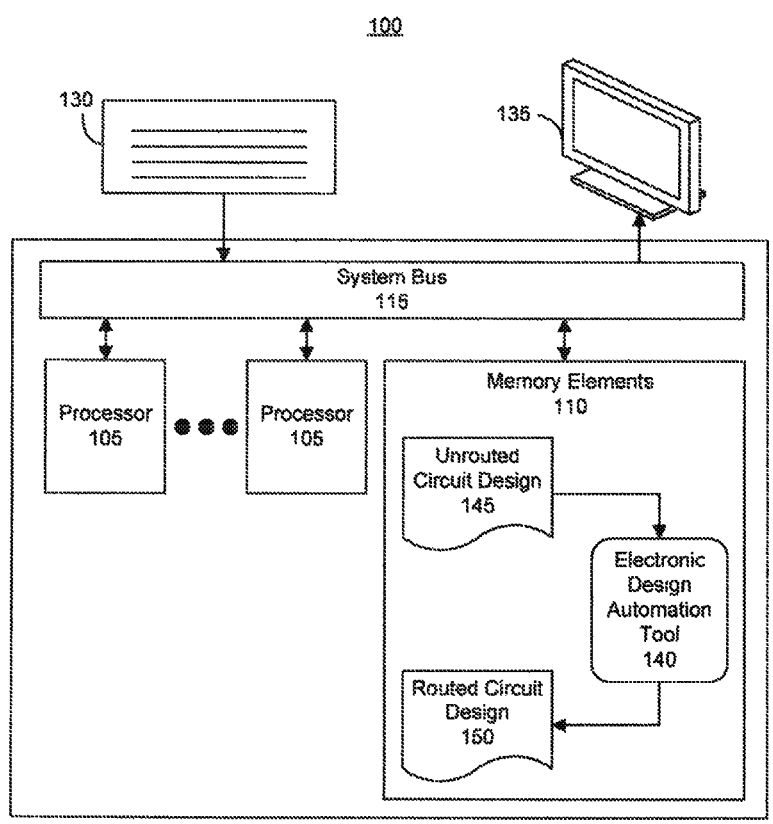
FIG. 1 is a block diagram illustrating a system for routing a circuit design in accordance with one embodiment of the present invention.

FIG. 1 is a block diagram illustrating a system 100 for routing a circuit design in accordance with one embodiment of the present invention. In one aspect, system 100 can be implemented as a multi-core system. More particularly, system 100 can include multiple processors, whether the processors are implemented in the form of multiple IC devices where each device includes a single processor (e.g., a single core-processor), as one or more IC devices where each device comprises a plurality of processors (multi-core processors), or the like.

For purposes of illustration, each processor can be said to execute one thread within system 100. Thus, the term "thread" and "processor," as used within this specification, are used interchangeably from time to time. Reference to a thread, for example, also refers to the particular processor executing that thread and vice versa. It should be appreciated, however, that one or more embodiments disclosed within this specification can be implemented using a single-core processor (single processor) and/or can be performed or executed by a single thread.

As shown in FIG. 1, system 100 can include one or more processors 105, each coupled to memory elements 110 through a system bus 115. As such, system 100 can store program code within memory elements 110. Processors 105 can execute the program code accessed from memory elements 110 via system bus 115. In one aspect, for example, system 100 can be implemented as a computer that is suitable for storing and/or executing program code. It should be appreciated, however, that system 100 can be implemented in the form of any system comprising one or more processors and memory that is capable of performing the functions described within this specification.

Memory elements 110 can include one or more physical memory devices such as, for example, local memory and one or more bulk storage devices. Local memory generally refers to random access memory or other non-persistent memory device(s) used during actual execution of the program code.

Bulk storage device(s) can be implemented as a hard drive or other persistent data storage device. System 100 also can include one or more cache memories that provide temporary storage of at least some program code in order to reduce the number of times program code must be retrieved from the bulk storage device during execution.

System bus 115 facilitates accesses (e.g., reads and/or writes) to memory elements 110 by each of processors 105, thereby allowing each respective one of processors 105 to share content stored within memory elements 110. For example, threads can communicate with one another by storing information in shared memory and by following measures that ensure that memory accesses do not conflict.

It should be appreciated that system 100 is provided as one example. In an alternate embodiment, each of processors 105 can have, or include, a memory or memory elements associated with that processor. Each of processors 105 can, for example, communicate with each other processor through a local network. In such an embodiment, threads can communicate through the passing of messages requesting data and providing results.

Input/output (I/O) devices such as a keyboard 130, a display 135, and a pointing device (not shown) optionally can be coupled to system 100. The I/O devices can be coupled to system 100 either directly or through intervening I/O controllers. Network adapters also can be coupled to system 100 to enable system 100 to become coupled to other systems, computer systems, remote printers, and/or remote storage devices through intervening private or public networks. Modems, cable modems, and Ethernet cards are examples of different types of network adapters that can be used with system 100.

As pictured in FIG. 1, memory elements 110 can store an EDA tool 140. EDA tool 140, being implemented in the form of executable program code, can be executed by system 100. EDA tool 140 can perform routing functions using a multi-threaded and deterministic routing technique executed across processors 105, at least in part, in parallel. Thus, as illustrated, an unrouted circuit design 145 can be received, e.g., stored, within memory elements 110 of system 100. System 100, executing EDA tool 140, can process unrouted circuit design 145 to generate and output a routed circuit design 150. As used herein, "outputting" and/or "output" can mean storing in memory elements 110, for example, writing to a file stored in memory elements 110, writing to display 135 or other peripheral output device, sending or transmitting to another system, exporting, or the like.

In general, circuit designs for programmable ICs are routed by assigning routing resources such as wires to nets of the circuit design. When each net of the circuit design is routed, e.g., assigned routing resources from the target programmable IC, in a manner that does not have any overlap, the circuit design has been successfully routed. Other considerations also can enter into the routing process such as timing, power consumption, and the like.

The term "overlap" refers to the condition in which two or more nets utilize the same routing resource, e.g., wire, of the target programmable IC to effectuate routing of each respective net. As used within this specification, the term "net" can be used interchangeably with the term "signal." Accordingly, an overlap is, effectively, a short circuit between each net that shares the same routing resource and is, therefore, an illegal condition that must be removed from the circuit design for proper operation. When two nets include a same routing resource, the two nets overlap one another and each net can be said to "include" or "have" overlap.

Typically, each routing resource is assigned a particular "cost." The circuit design is routed in a manner that seeks to minimize the overall cost of the routed circuit design. As the routing process continues in an iterative fashion, the costs of routing resources that are highly sought after by different nets of the circuit design are increased, thereby causing the router to seek a way to route the net without using the congested (high cost) routing resources. Further information relating to routing circuit designs can be found within L. McMurchie and C. Ebeling, *Pathfinder: A Negotiation-based Performance-Driven Router for FPGAs*, Proceedings of the Third International Symposium on Field-Programmable Gate Arrays (1995), which is incorporated herein in its entirety by reference.

In general, the cost of any given routing resource R within the target programmable IC can be calculated as $Cost(R) = (BasicCost + Hist\_Cong) * (1 + SharePenalty * Num\_Contend)$. Within this expression, the term BasicCost defines a basic cost of using a routing resource. This can be set to a constant value. The term Hist_Cong refers to the "historical congestion" of routing resource R. The historical congestion refers to the congestion history of routing resource R, which is increased after each iteration in which there is a conflict for the routing resource R. The term SharePenalty is a penalty value. SharePenalty can be set to an initial value and incremented at various points during the routing process to facilitate convergence to a solution. The term Num_Contend refers to the number of contenders for a given routing resource. For example, when routing resource R is assigned to four different nets, the number of contenders for routing resource R is four.

The phrase "congestion picture" refers to the congestion caused by competition for routing resources by nets of the circuit design across the target programmable IC. For example, at various points during the routing process, the cost of a particular routing resource, a particular set of routing resources, or all routing resources can be updated. The congestion picture refers to the set of costs, for example, as determined according to the historical congestion and the number of contenders, calculated for the routing resources of the target programmable IC. Thus, the congestion picture reflects a set of costs for routing resources at a given point in time in the routing process.

It should be appreciated that while one or more embodiments described within this specification refer to routing a circuit design and involve performing an initial route of the circuit design, one or more embodiments also can be used as part of an overlap removal process. In this sense, though the various flow charts include or describe an initial routing step, an initial routing step would not be necessary since the circuit design would be available in a form with routing information that includes overlaps that must be removed. Accordingly, when used to remove overlap(s), the various steps that reference an initial routing phase or task can be omitted so that the methods described within this specification begin with an analysis of overlap within the circuit design so that the overlap can be removed and/or corrected.

Figure 2:
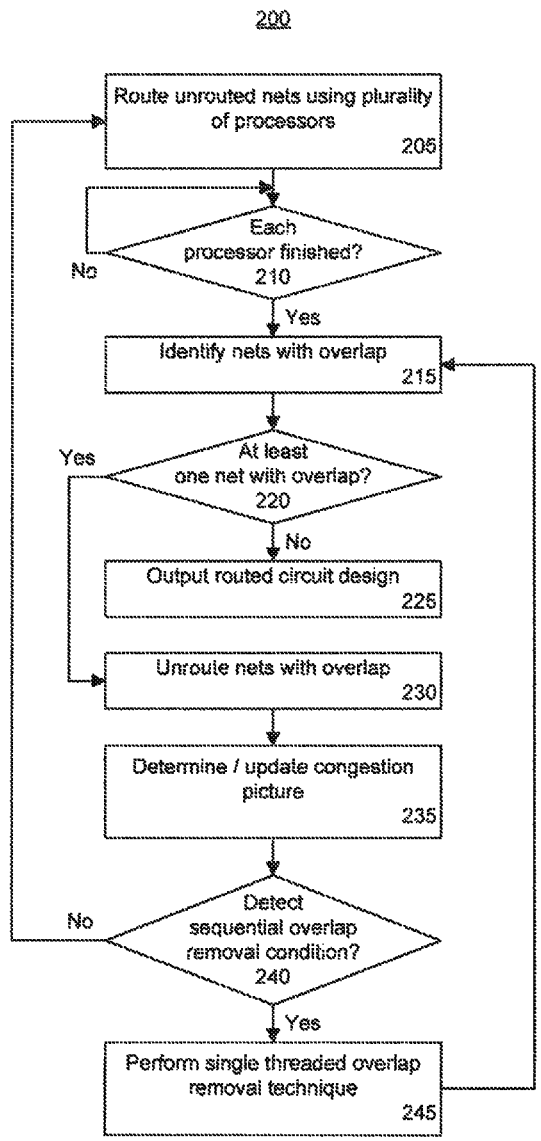
FIG. 2 is a first flow chart illustrating a method of routing a circuit design in accordance with another embodiment of the present invention.

FIG. 2 is a first flow chart illustrating a method 200 of routing a circuit design in accordance with another embodiment of the present invention. Method 200 can be performed by the system of FIG. 1 to route an unrouted circuit design. Method 200 can begin in a state where a circuit design that has not yet been routed has been loaded into the system, e.g., stored within the memory elements.

Accordingly, method 200 can begin in step 205 where the system can route unrouted nets of the circuit design. During the first iteration of method 200, the system, in step 205, performs an initial route of the circuit design. The system can perform the initial route using a plurality of processors, with each processor executing in parallel with each other processor to route nets. Any of a variety of different techniques for distributing nets to processors can be used so that each processor continues to route those nets allocated or assigned to that processor until each net of the circuit design has been routed. For example, any of the various allocation techniques described within this specification can be used. The initial route of the circuit design is performed in a manner that permits overlap to occur. During subsequent iterations, the system, in step 205, routes only those nets that were unrouted, e.g., in step 230.

In step 210, the system determines whether each processor has finished routing nets. When each processor has finished routing nets, method 200 can proceed to step 215 to continue the multi-threaded routing technique. When one or more processors has not finished routing nets, method 200 can loop back until each processor has completed execution. When each processor completes execution during the first iteration through step 210, the system has routed each net in the circuit design and completed the initial routing.

In step 215, the system identifies those nets of the circuit design that have overlap, if any. In step 220, the system determines whether one or more nets of the circuit design include overlap. When one or more nets of the circuit design include overlap, method 200 continues to step 230. When none of the nets of the circuit design includes overlap, e.g., the circuit design is free of overlap, method 200 can continue to step 225 where the routed circuit design, or routing information for the circuit design, can be output.

Beginning in step 230, at least for the first iteration through method 200, the system begins a multi-threaded overlap removal process. In step 230, the system can unroute the nets identified in step 215 that included overlap. In step 235, the system can determine, or update as the case may be, a congestion picture. As noted, the congestion picture represents the cost of each routing resource of the target programmable IC. Because the nets that included overlap were unrouted prior to determining the congestion picture, the term Num_Contend in the cost expression discussed with reference to FIG. 1, will, at most, have a value of one for any routing resource. Those routing resources that were utilized in nets with overlap that were unrouted in step 230 have a value of Num_Contend that is equal to zero. Those routing resources that are utilized by nets without overlap have a value of Num_Contend that is equal to one.

Thus, when considering the sub-expression (1+SharePenalty*Num_Contend), which can be referred to as the current congestion of a routing resource R, only routing resources currently used within nets that do not have overlap are considered in the current congestion. Those routing resources allocated to the nets that were unrouted in step 230, which therefore belong to no nets, have a current congestion that is equal to one. As such, the routing resources that were previously used by nets unrouted in step 230 have a cost that is, in effect, determined from the sub-expression (BasicCost+Hist_Cong). The sub-expression (BasicCost+Hist_Cong) is driven by the historical congestion since the basic cost is constant throughout the routing process. In this regard, it can be said that each unrouted net only contributes to the current congestion to the extent that the net remains partially routed. As a general example, since a net can have two load pins, a situation can arise in which one of the load pins is routed while the other is not, resulting in a partially routed net. When no part of a net is routed, that net does not contribute to the current congestion. Previously used routing resources of the unrouted net do not contribute to the current congestion.

In step 240, the system can determine whether a sequential overlap removal condition has been detected. When a sequential overlap removal condition is detected, method 200 can continue to step 245. When no sequential overlap removal condition is detected, method 200 can loop back to step 205, where unrouted nets of the circuit design can be routed in parallel using the plurality of processors. The unrouted nets of the circuit design are routed according to the congestion picture, which is not updated again until step 235. Thus, each processor operates off of a same or common congestion picture.

The sequential overlap removal condition can refer to any of a variety of measures that, when evaluated by the system, cause the system to perform a single-threaded overlap removal technique. In one embodiment, the single-threaded overlap removal technique can be implemented as a single-threaded routing technique applied to any unrouted nets, e.g., nets unrouted in step 230. Any of a variety of conventional routing techniques not optimized or suited for implementation using parallel executing processors can be used. One example of a sequential overlap removal condition can be when the number of nets with overlap does not decrease by a minimum number or percentage from one iteration of method 200 to the next, or over a predetermined number of iterations of method 200.

Accordingly, continuing with step 245, when a sequential overlap removal condition is detected, the system can route the nets of the circuit design that were unrouted in step 230 using a single-threaded routing technique. In one embodiment, the system can order the nets according to timing criticality. The most timing critical net can be routed first, then the next most critical, and so on. After step 245, method 200 can loop back to step 215 to continue processing.

During subsequent iterations of steps 215 and 220, the system continues to detect congestion among all nets. For example, the system can determine the overlap between those nets that were not unrouted (e.g., had no overlap) and those nets that included overlap, were unrouted in step 230, and then re-routed during the subsequent iteration of step 205. Thus, any nets that participate in an overlap, even if not routed in the current iteration, are not counted in the current congestion since those nets are unrouted in step 230. Overlap, however, is recorded in historical congestion of each routing resource within the congestion picture.

As method 200 continues to iterate, the SharePenalty used when Num_Contend is equal to one, e.g., non-zero, for any routing resource can grow exponentially. The current congestion grows by the share penalty, which serves as a factor that increases in each iteration. For example, the share penalty can be incremented during each iteration of step 235. In consequence, the cost of using a routing resource that is already used by another net, e.g., currently in use, increases rapidly from one iteration to the next, thereby reducing the likelihood of selecting a routing resource that is currently in use to route one of the nets unrouted in step 230.

Figure 3:
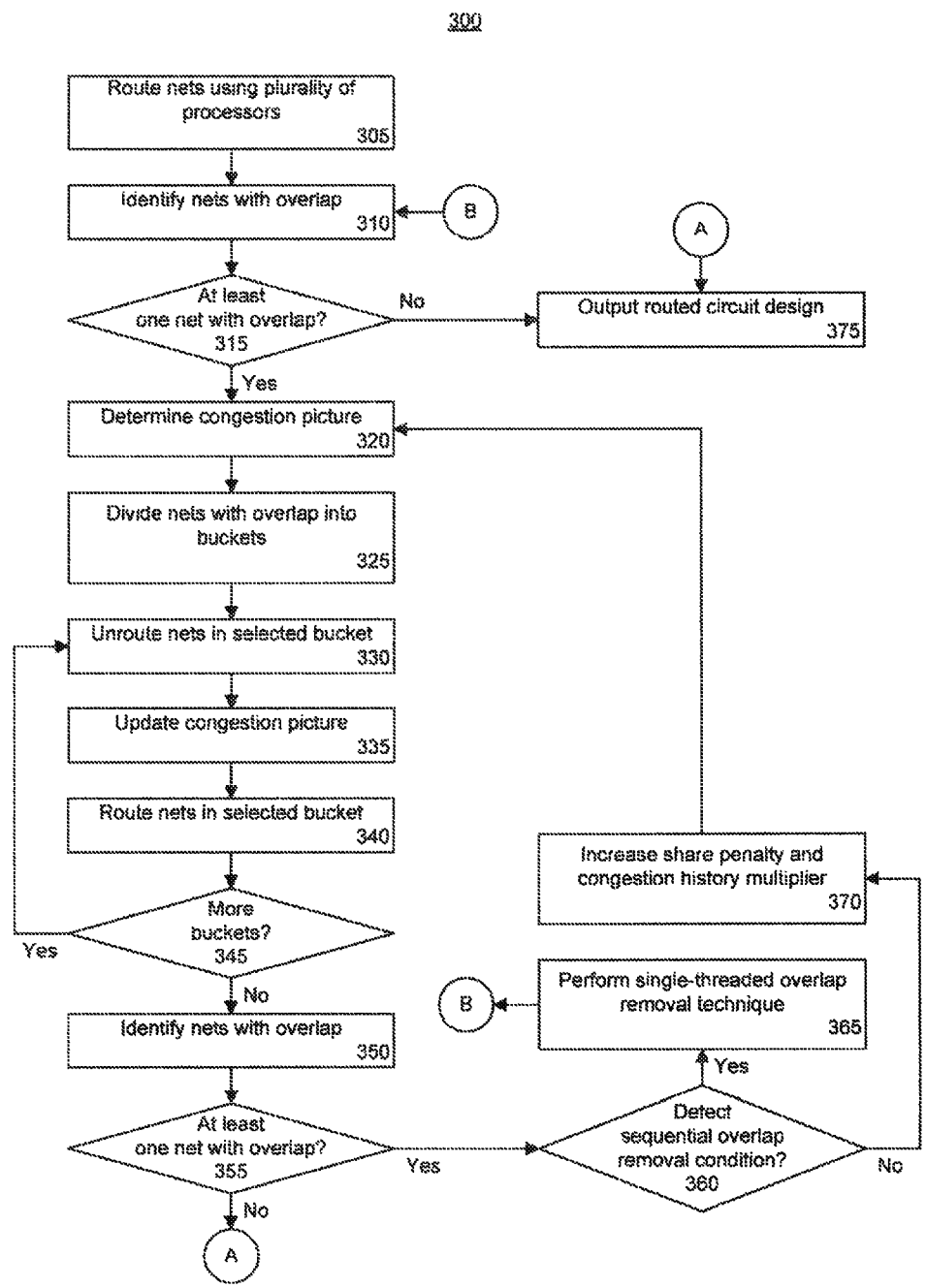
FIG. 3 is a second flow chart illustrating a method of routing a circuit design in accordance with another embodiment of the present invention.

FIG. 3 is a second flow chart illustrating a method of routing a circuit design in accordance with another embodiment of the present invention. Method 300 can be performed by the system of FIG. 1 to route an unrouted circuit design. In this embodiment, nets in the circuit design to be routed can be partitioned, or divided, into buckets and processed on a bucket-by-bucket basis. The buckets can be processed using a multi-threaded or a single-threaded routing technique. The partitioning of nets into buckets can be performed using a variety of techniques based upon various properties.

Method 300 can begin in a state where a circuit design that has not yet been routed has been loaded into the system, e.g., stored within the memory elements. Method 300 can begin in step 305 where the system can perform an initial route of the circuit design using a plurality of processors. As discussed with reference to FIG. 2, the initial route of the circuit design can be performed using a multi-threaded routing technique that permits overlaps to occur among the nets of the circuit design. For ease of illustration, method 300 presumes that each processor completes execution prior to proceeding to step 310 as described with reference to step 210 of FIG. 2. In step 310, the system can identify any nets of the circuit design that include overlap.

In step 315, the system can determine whether one or more nets of the circuit design include overlap. When one or more nets include overlap, method 300 can proceed to step 320. When there are no nets that include overlap, method 300 can continue to step 375. In step 320, the system can determine the congestion picture. In one aspect, the system can calculate the congestion picture over each of the routing resources of the target programmable IC using the cost expression previously described with reference to FIG. 1.

In step 325, the system can divide the nets that have been identified in step 315 as including overlap into buckets. Buckets refer to groupings of one or more nets of the circuit design and can be generated using any of a variety of different techniques. Some techniques facilitate convergence of the routing process by reducing the likelihood that re-routing nets will introduce new overlaps into the circuit design. One set of techniques for reducing the likelihood of introducing new overlaps can be to use geographic restrictions when generating buckets.

In one embodiment, for example, each net in a selected bucket will not overlap, e.g., include a routing resource used by, any other net in the same bucket. Thus, while each net in a bucket can include at least one overlap, the nets in the same bucket do not overlap with one another. Because the nets in a bucket are processed concurrently using a plurality of processors, including only non-overlapping nets within each bucket reduces the likelihood that nets in any given bucket will compete for the same routing resources, thereby reducing the likelihood of overlap occurring when the nets of that bucket are re-routed.

While not overlapping with one another addresses geographic restrictions in a general manner, other more explicit geographic restrictions can be implemented when generating buckets. For example, in addition to the aforementioned restrictions, nets placed within the same bucket also can be separated from one another by at least a predetermined distance. The distance type of geographic restriction also reduces the likelihood of overlaps occurring as will be more apparent from the description of FIG. 4 where the multi-threaded nature of bucket processing is illustrated in greater detail.

The distance between nets can be measured using any of a variety of different distance measurement techniques suitable for measuring distances upon a target programmable IC. For example, a bounding box can be drawn around each net and the distance between edges of the respective bounding boxes surrounding the nets at the closest point can be used. In another example, the center or weighted geographic center of each net can be used to calculate distance between nets. The particular manner in which distance between nets is calculated is not intended as a limitation of the embodiments disclosed within this specification.

Still, other non-geographic restrictions can be applied to the bucket generation process. For example, in addition to applying the non-overlapping requirement described above, the size of buckets can be regulated. In one aspect, the size of each bucket can be determined according to the total number of congested nets and the history of congestion occurring during the overlap removal process. In another aspect, the size of the buckets can be determined according to a fixed number or a predetermined percentage, for example, of total nets in the circuit design or of total congested nets at the start of the overlap removal process.

In step 330, each net within a selected bucket can be unrouted. With the nets in the selected bucket unrouted, the congestion picture can be updated per the congestion expression for each routing resource of the target programmable IC in step 335. In step 340, the nets in the selected bucket can be routed or re-routed as the case may be. Within step 340, the nets of the selected bucket can be routed using a multi-threaded routing technique, a single-threaded routing technique, or a combination of both. In step 345, the system can determine whether more buckets remain to be processed. When one or more buckets remain to be processed, method 300 can loop back to step 330 to select a next bucket for processing. When no further buckets remain to be processed, the system can proceed to step 350.

Continuing with step 350, the system can identify any nets of the circuit design that include overlap. In step 355, the system can determine whether one or more nets include overlap. When one or more nets include overlap, method 300 can proceed to step 360. When no net includes overlap, method 300 can continue to step 375.

In step 360, the system can determine whether a sequential overlap removal condition has been detected. When a sequential overlap removal condition has been detected, method 300 can continue to step 365, where a single-threaded overlap removal technique can be performed. After step 365, method 300 can continue to step 310. When no net includes overlap, method 300 can proceed through steps 310 and 315 to step 375. In step 375, the routed circuit design, or at least the routing information for the circuit design, can be output.

Proceeding with step 370, where the system has not detected a sequential overlap removal condition, the system can increase the share penalty and the congestion history used within the cost expression. After step 370, method 300 can continue to step 320, where the congestion picture can be updated using the newly incremented values for the share penalty and the congestion history. It should be appreciated that when overlap(s) are removed using a single-threaded routing technique, steps 360 and 365 can be omitted or skipped.

Figure 4:
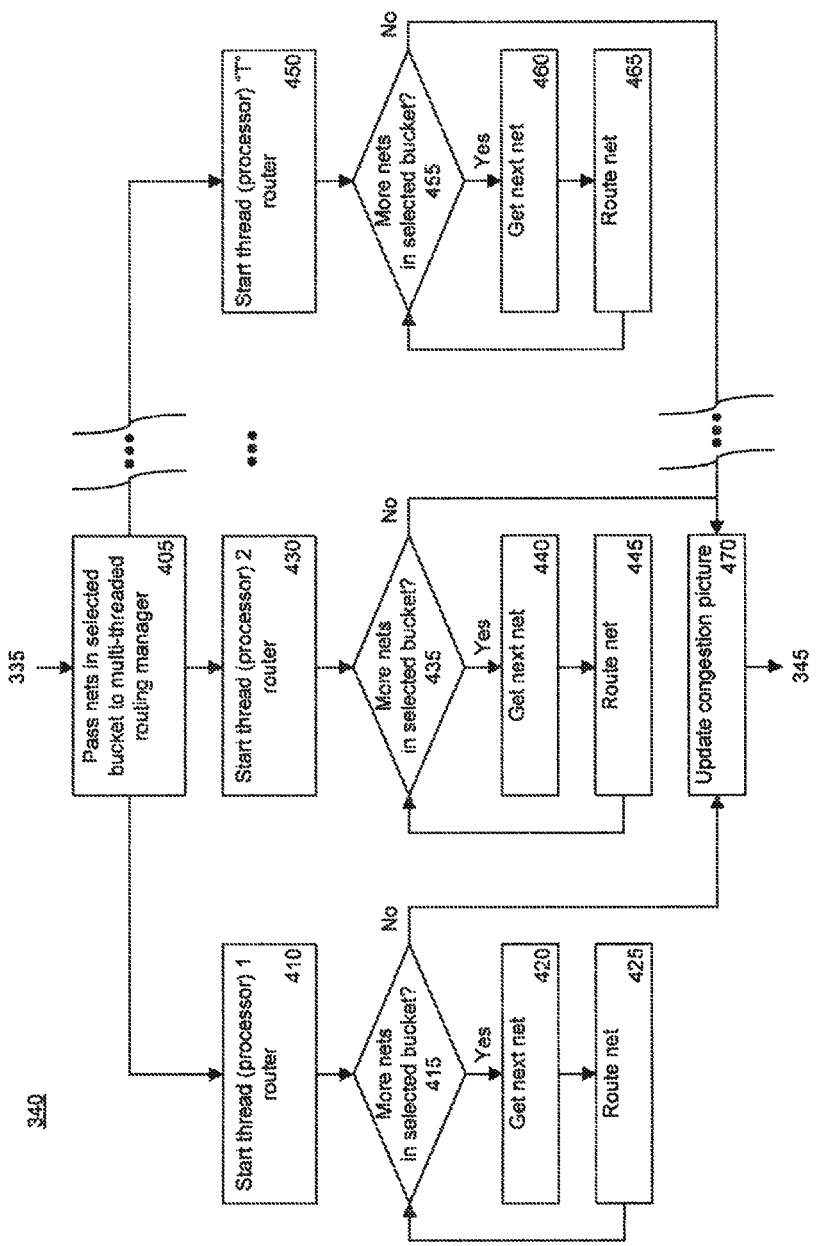
FIG. 4 is a third flow chart illustrating a method of routing nets of a selected bucket in accordance with another embodiment of the present invention.

FIG. 4 is a third flow chart illustrating a method of processing buckets of nets in accordance with another embodiment of the present invention. More particularly, FIG. 4 illustrates one example of how step 340 of FIG. 3 can be implemented by the system described with reference to FIG. 1. FIG. 4 illustrates a multi-threaded technique for processing each of the buckets. As shown, step 405 can be entered from step 335 of FIG. 3. Within step 405, the nets in the selected bucket can be passed to a multi-threaded routing manager. The multi-threaded routing manager manages the distribution and assignment of nets within the selected bucket to different threads (processors) of the system for routing.

In general, the system can include a number of threads from 1 to T, where T is an integer value that is equal to the number of processors present within the system and available for the routing task. Accordingly, within each of steps 410, 430, and 450, the different threads 1-T can begin execution. More particularly, each processor, corresponding to a thread, can begin executing a routing process in parallel. In step 415, 435, and 455, each thread or processor determines whether there are any further nets in the selected bucket that require routing. Each thread can query the multi-threaded routing manager for a next net of the selected bucket to be routed. Based upon the response from the multi-threaded routing manager, or, in the alternative, a determination made by each respective thread using information provided by the multi-threaded routing manager, each thread will continue to obtain, or "get," the next net in each of steps 420, 440, and 460, or will proceed to step 470 when no further nets remain to be processed.

In steps 420, 440, and 460, each of threads 1-T can get a next net to be routed from the selected bucket from the multi-threaded routing manager. In steps 425, 445, and 465, each of threads 1-T can route the net assigned to that thread. Once completed, threads 1-T loop back to steps 415, 435, and 455 respectively. Though illustrated in an aligned manner in FIG. 4, it should be appreciated that each of threads 1-T can execute at a different speed, though concurrently with each other thread.

In step 470, the system can update the congestion picture. Only when all of the nets in the selected bucket have been routed is the congestion picture updated. When updating the congestion picture in step 470, the congestion picture is updated in a local manner. More particularly, the local congestion reflected in the congestion picture is updated. The local congestion refers to the congestion, e.g., set of costs, of only those routing resources utilized in routing the selected bucket of nets. For example, the number of contenders upon each routing resource can change. The historical congestion and the share penalty are not updated until such time that all buckets have been processed and the overall method illustrated in FIG. 3 iterates. This is demonstrated within step 370 of FIG. 3. As each bucket is processed, however, the local congestion reflected in the congestion picture is updated in step 470, where local refers to nets in the bucket currently being processed. Thus, with reference to FIG. 4, local congestion is bucket-specific. Accordingly, local congestion can be referred to, or viewed as, "bucket-local congestion" in reference to the congestion resulting from routing nets of a particular bucket. After step 470, the method can continue to step 345 of FIG. 3.

FIG. 4 illustrates that while each bucket is being processed, each thread utilizes a same congestion picture. More particularly, the congestion picture does not change while routing nets of a same bucket. The congestion picture only changes, at least with respect to local congestion, after processing each respective bucket in step 470. Global aspects of the congestion picture are changed after each iteration of processing all buckets, e.g., in step 370. By updating the congestion picture in this manner, the multi-threaded routing of the nets remains a deterministic process since the same routes are created in parallel as would be created using a sequential, single-threaded routing technique.

Figure 5:
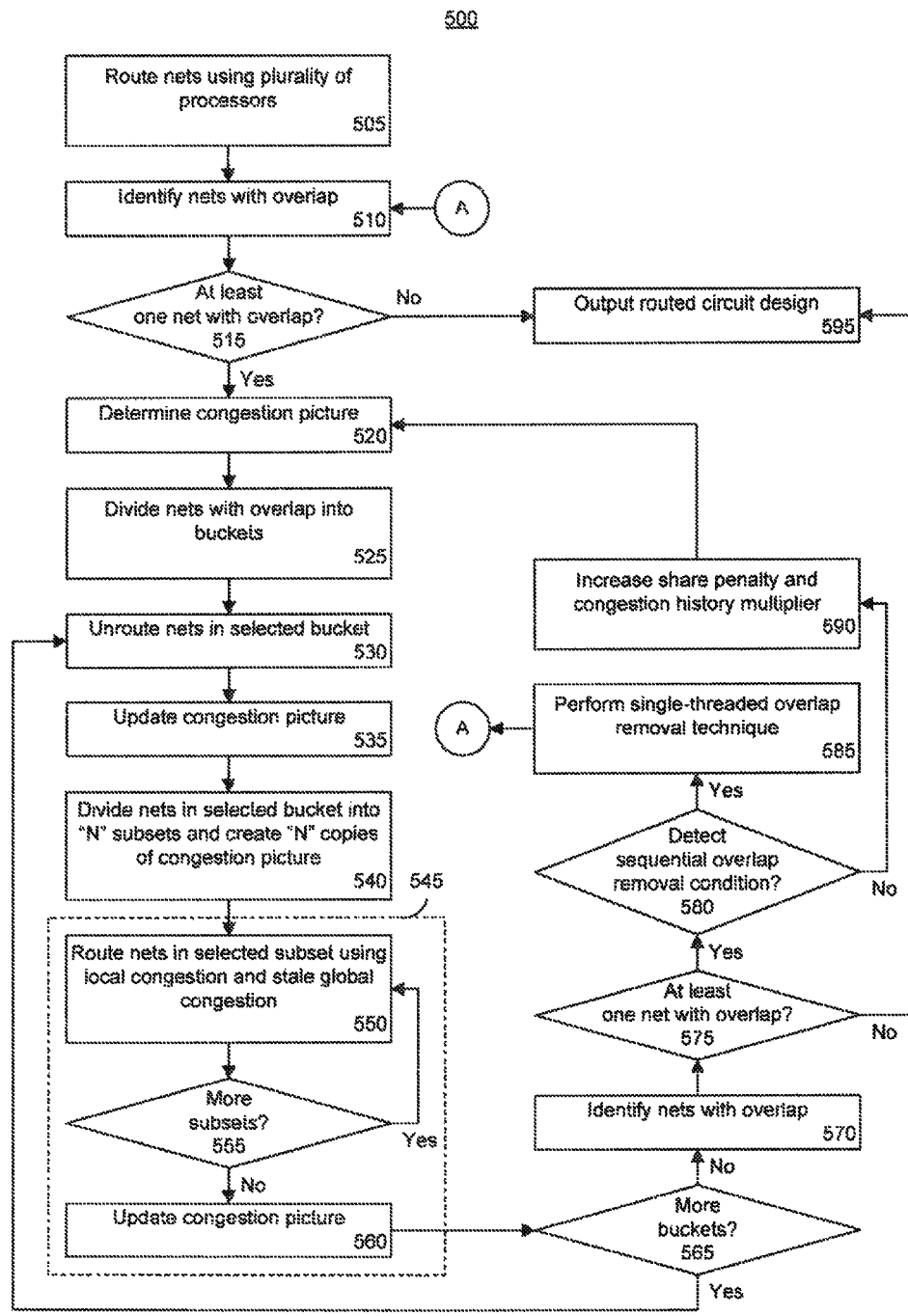
FIG. 5 is a fourth flow chart illustrating a method of routing a circuit design in accordance with another embodiment of the present invention.

FIG. 5 is a fourth flow chart illustrating a method of routing a circuit design in accordance with another embodiment of the present invention. Method 500 can be performed by the system of FIG. 1 to route an unrouted circuit design. Method 500 can begin in a state where a circuit design that has not yet been routed has been loaded into the system, e.g., stored within the memory elements. Method 500 introduces subsets into each bucket to improve the convergence characteristics of the multi-threaded routing process.

Method 500 can begin in step 505 where the system can perform an initial route of the circuit design using a plurality of processors. The initial route can be performed using a multi-threaded routing technique that permits overlaps to occur. In step 510, the system can identify any nets of the circuit design that include overlap. In step 515, the system can determine whether there is at least one net that includes overlap. When one or more nets include overlap, method 500 can proceed to step 520. When there are no nets that include overlap, method 500 can continue to step 595.

In step 520, the system can determine the congestion picture. In step 525, the system can divide the nets that have been identified in step 510 as including overlap into buckets as described with reference to FIG. 3. In step 530, each net within a selected bucket can be unrouted. With the nets in the selected bucket unrouted, the congestion picture can be updated in step 535 per the congestion expression for each routing resource of the target programmable IC. In step 540, the nets in a selected bucket can be subdivided into N subsets, where N is an integer value that can be greater than, less than, or equal to the number of processors within the system. N copies of the congestion picture also can be generated. In general, each subset is associated with a particular copy of the congestion picture.

Box 545, comprising steps 550, 555, and 560, generally represents the processing of buckets according to the N subsets determined in step 540. A more detailed description of the processing performed by box 545 is described with reference to FIG. 6. In any case, in step 550, the nets in a selected subset of a selected bucket can be routed. In general, subsets are routed concurrently by the multiple threads. Each thread maintains an individual copy of the congestion picture associated with the particular subset assigned to that thread.

Thus, subset 1 is associated with congestion picture copy 1. Thread 1 routes the nets of subset 1 and updates congestion picture copy 1 to reflect routing of only those nets included within subset 1 as each net is routed. Congestion picture copy 1 does not reflect the congestion caused by nets that are not included in subset 1. Similarly, subset 2 is associated with congestion picture copy 2. Thread 2 routes the nets of subset 2 concurrently with thread 1 and updates congestion picture copy 2 to reflect routing of only those nets included within subset 2 as each net of subset 2 is routed. Congestion picture copy 2 does not reflect the congestion caused by nets that are not within subset 2. Accordingly, the copy of the congestion picture, for a selected subset, is updated by the thread tasked with routing the nets of the selected subset. The portion of the copy of the congestion picture for the thread that relates to those nets not in the subset is not updated.

Thus, each thread operates using an updated local congestion in the sense that a selected thread updates the portions of the copy of the congestion picture maintained by the selected thread that relate to nets in the subset being routed. In this regard, the local congestion can be viewed as a "thread-local congestion" in that the local congestion is thread specific. Each thread uses a stale global congestion in the sense that the copy of the congestion picture maintained by the selected thread does not reflect the state of routing resources, or changes thereto, that occur in consequence of nets being routed by other threads not included within the subset being routed by the selected thread. In further illustration, how Num_Contend is computed will continue to change on a local level, e.g., in each thread. When creating copies of the congestion picture, the global Num_Contend value is copied for each subset. When the nets in a selected subset are routed, Num_Contend in the relevant copy of the congestion picture for the selected subset is updated in consequence of the routing. Nets not in the selected subset do not influence Num_Contend data for the selected subset.

In step 555, the system can determine whether there are any further subsets to be processed in the selected bucket. When more subsets remain to be processed, method 500 can loop back to step 550 to continue processing. When no further subsets of the selected bucket remain to be processed, method 500 can proceed to step 560 where the system updates the congestion picture. More particularly, the various copies of the congestion picture can be merged to form, or update, as the case may be, the congestion picture. The updated congestion picture reflects the state of each copy of the congestion picture maintained by each thread. Thus, the updated congestion picture reflects the global congestion and serves as the "master" from which copies of the congestion picture are made for subsequent iterations.

Continuing with step 565, the system can determine whether there are any further buckets to be processed. When one or more buckets remain to be processed, method 500 can loop back to step 530 to continue processing a next selected bucket. When no further buckets remain to be processed, method 500 can proceed to step 570. In step 570, the system can identify any nets that include overlap. In step 575, the system can determine whether one or more nets include overlap. When one or more nets include overlap, method 500 can proceed to step 580. When no nets of the circuit design include overlap, method 500 can continue to step 595, where the routed circuit design, or at least routing information for the circuit design, can be output.

Continuing with step 580, the system can determine whether a sequential overlap removal condition has been detected. When a sequential overlap removal condition has been detected, method 500 can continue to step 585, where a single-threaded overlap removal technique can be performed. After step 585, method 500 can continue to step 510. When no net includes overlap, method 500 can proceed through steps 510 and 515 to step 595.

Proceeding with step 590, where the system has not detected a sequential overlap removal condition, the system can increase the share penalty and the congestion history used within the cost expression to compute the congestion picture. After step 590, method 500 can continue to step 520, where the congestion picture can be updated using the newly incremented values for the share penalty and the congestion history.

Figure 6:
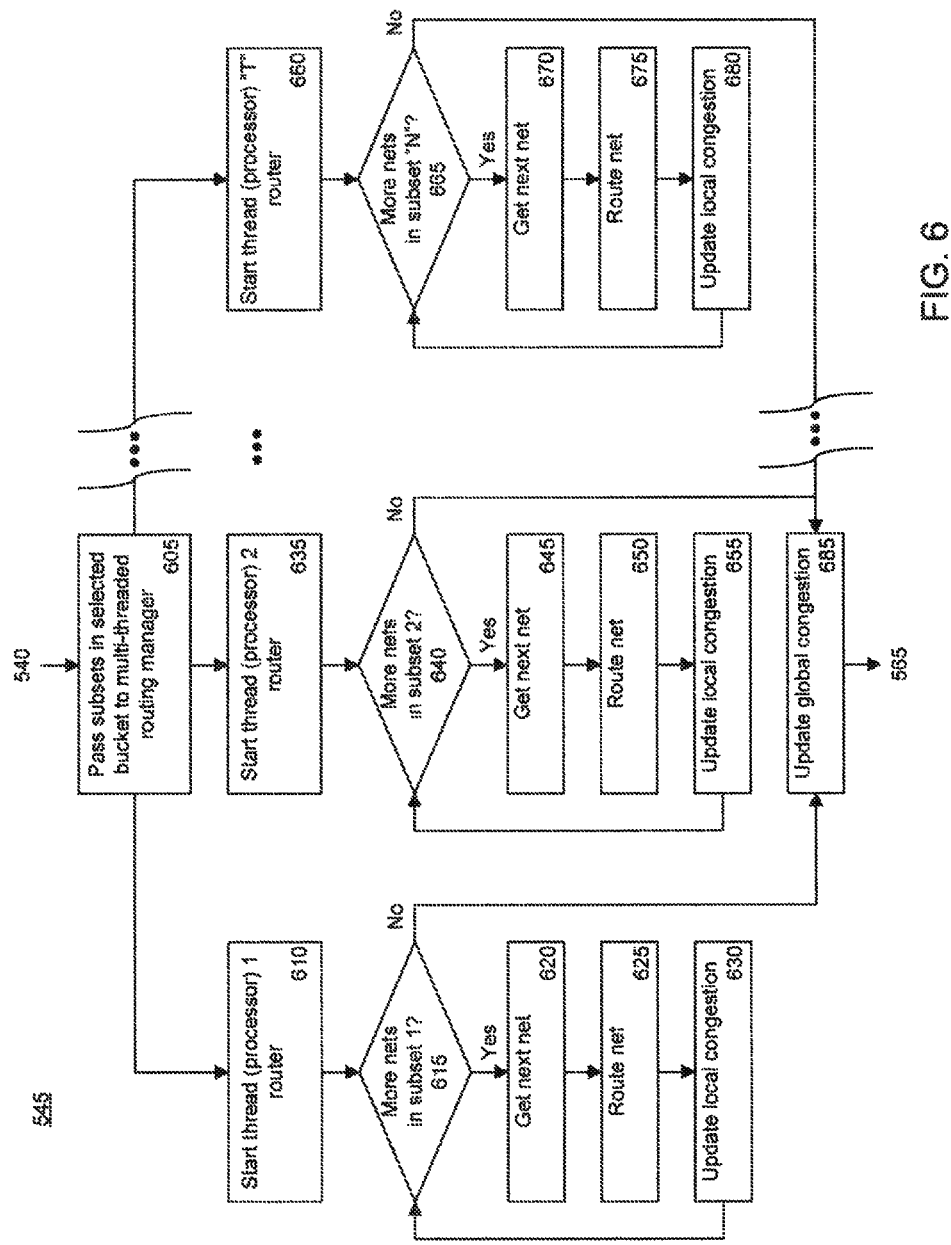
FIG. 6 is a fifth flow chart illustrating a method of routing nets of subsets of a selected bucket in accordance with another embodiment of the present invention.

FIG. 6 is a fifth flow chart illustrating a method of processing nets of subsets within a selected bucket in accordance with another embodiment of the present invention. More particularly, method 600 illustrates one example of how block 545 of FIG. 5 can be implemented by the system described with reference to FIG. 1. FIG. 6 illustrates a multi-threaded technique for processing each of the subsets of a selected bucket.

As shown, step 605 can be entered from step 540 of FIG. 5. Within step 605, the subsets in the selected bucket can be passed to the multi-threaded routing manager. Within the embodiment described in FIG. 6, the multi-threaded routing manager can manage the distribution and assignment of subsets of nets as well as individual nets within each subset, for the selected bucket, to different threads (processors) of the system for routing.

As discussed with reference to FIG. 4, the system can include a number of threads from 1 to T, where T is an integer value that is equal to the number of processors present within the system and available for the routing task. Accordingly, within each of steps 610, 635, and 660, the different threads 1-T begin execution. As noted, each thread is assigned, or requests, a subset of nets to route from the selected bucket. In steps 615, 640, and 665, each thread determines whether there are any further nets in the subset assigned to that thread that require routing. Each thread can query the multi-threaded routing manager for a next net to be routed in the subset assigned to that thread. Based upon the response from the multi-threaded routing manager, each thread continues to obtain the next net in each of steps 620, 645, and 670, or will proceed to step 685 when no further nets remain to be processed for a given subset.

In steps 620, 645, and 670, each of threads 1-T can get a next net to be routed from the multi-threaded routing manager. For example, thread 1 can obtain a next net from subset 1, thread 2 can obtain a next net from subset 2, etc. In steps 625, 650, and 675, each of threads 1-T routes the net obtained during the prior step. In steps 630, 655, and 680, each thread updates the local congestion of the copy of the congestion picture created for that thread. Recall from FIG. 5 that a copy of the congestion picture was created for each subset in the selected bucket. The embodiment illustrated in FIGS. 5 and 6 allows each thread to update the local congestion, e.g., the "thread-local congestion," as individual nets for each subset are routed. Because there is an individual copy of the congestion picture for each subset, each thread maintains the copy of the congestion picture for the particular subset being processed. Thus, the particular congestion picture for each of subsets 1-T will differ as each thread continues to route nets of the subset assigned to the thread. Once completed, threads 1-T loop back to steps 615, 640, and 665 respectively.

Deterministic results can be guaranteed if the number of subsets N is a fixed number regardless of the number of threads T. If the number of subsets N is less than the number of threads T, then only a number of threads T equal to N execute in parallel. If, however, the number of subsets N is greater than the number of threads T, then the first T subsets are assigned to T threads. Responsive to a thread completing execution, a next subset can be assigned to that thread until all subsets have been routed.

In step 685, the system can update the congestion picture when each net, e.g., all subsets, of the selected bucket have been routed. The various copies of the congestion picture can be merged to form, or update, as the case may be, the congestion picture. The congestion picture, generated from the combined copies, reflects the local congestion of each respective copy from each thread, thereby reflecting global congestion. The updated congestion picture can serve as the master congestion picture from which copies are generated in subsequent iterations. The historical congestion and the share penalty are not updated until such time that each bucket has been processed and the overall method illustrated in FIG. 5 iterates. This is demonstrated within step 590 of FIG. 5. After step 685, the method can continue to step 565 of FIG. 5.

Since the same up-to-date congestion picture is used to route each net within the same subset, the routing process can converge faster when nets are assigned to subsets based upon geographical location. Alternatively, the nets assigned to a given subset can be those that belong to a same "hot spot," in reference to a routing region, e.g., a region of the target programmable IC, that has at least a minimum amount of congestion.

The one or more embodiments described thus far have defined buckets so that no bucket includes any nets that overlap with one another. In another embodiment, however, buckets can be created that do include overlapping nets. More particularly, each net in the same bucket shares at least one routing resource with at least one other net in the same bucket. Nets in two different buckets do not overlap, or overlap less than some predetermined minimum amount or threshold. The system can create a copy of local congestion for each bucket. Using this technique, the nets in a same bucket see new congestion caused by routing one another (nets of the same bucket), but see only old or stale congestion of nets in other buckets. Since each bucket can be routed independently of each other bucket, a first thread can route all nets in the first bucket, a second thread can route all nets in the second bucket, and so on.

As discussed, one or more embodiments described within this specification also can be used for performing overlap removal. In that case, the manner in which the initial route of the circuit design is performed can be single-threaded or multi-threaded so long as at least one overlap exists that must be removed from the circuit design.

The flowcharts in the figures illustrate the architecture, functionality, and operation of possible implementations of systems, methods and computer program products according to one or more embodiments of the present invention. In this regard, each block in the flowcharts may represent a module, segment, or portion of code, which comprises one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

One or more embodiments of the present invention can be realized in hardware or a combination of hardware and software. One or more embodiments can be realized in a centralized fashion in one system or in a distributed fashion where different elements are spread across several interconnected systems. Any kind of data processing system or other apparatus adapted for carrying out the methods described herein is suited.

One or more embodiments of the present invention further can be embedded in a device such as a computer program product, which comprises all the features enabling the implementation of the methods described herein. The device can include a data storage medium, e.g., a computer-usable or computer-readable medium, storing program code that, when loaded and executed in a system comprising memory and at least one processor, causes the system to perform the functions described herein. Examples of data storage media can include, but are not limited to, optical media, magnetic media, magneto-optical media, computer memory such as random access memory or hard disk(s), or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed herein can be embodied in other forms without departing from the spirit or essential attributes thereof. Accordingly, reference should be made to the following claims, rather than to the foregoing specification, as indicating the scope of one or more embodiments of the present invention.

What is claimed is:

1. Within a system comprising a plurality of processors and a memory, a method of determining routing information for a circuit design for implementation within an integrated circuit, the method comprising:
    determining that nets of the circuit design comprise overlap;
    unrouting the nets of the circuit design comprising overlap;
    determining a congestion picture comprising costs of routing resources for the programmable integrated circuit, wherein the cost of a routing resource comprises a measure of historical congestion and a measure of current congestion, and wherein unrouted nets do not contribute to the measures of current congestion in the congestion picture;
    concurrently routing a plurality of the unrouted nets, via the plurality of processors executing in parallel, according to the congestion picture; and
    storing routing information specifying routes for nets of the circuit design in the memory;
    wherein:
        the measure of current congestion is one plus a product of a share penalty and a number of contenders term;
        the number of contenders term is zero for a routing resource not used as part of a net from the unrouting; and
        cost of a routing resource comprises the measure of current congestion multiplied by the historical congestion.

2. The method of claim 1, further comprising:
    identifying a sequential overlap removal condition; and
    responsive to identifying the sequential overlap removal condition, performing a single-threaded routing technique;
    wherein the sequential overlap removal condition comprises determining that a number of nets with overlap does not decrease by a minimum amount over a predetermined number of iterations.

3. A non-transitory computer-readable medium having instructions which, when executed on a computer comprising a plurality of processors, perform a method comprising:
    determining that nets of the circuit design comprise overlap;
    unrouting the nets of the circuit design comprising overlap;
    determining a congestion picture comprising costs of routing resources for the programmable integrated circuit, wherein the cost of a routing resource comprises a measure of historical congestion and a measure of current congestion, and wherein unrouted nets do not contribute to the measures of current congestion in the congestion picture;

concurrently routing a plurality of the unrouted nets, via the plurality of processors executing in parallel, according to the congestion picture; and storing routing information specifying routes for nets of the circuit design in the memory;

wherein:

the measure of current congestion is one plus a product of a share penalty and a number of contenders term;

the number of contenders term is zero for a routing resource not used as part of a net from the unrouting; and cost of a routing resource comprises the measure of current congestion multiplied by the historical congestion.

4. The medium of claim 3, further comprising:

identifying a sequential overlap removal condition; and responsive to identifying the sequential overlap removal condition, performing a single-threaded routing technique;

wherein the sequential overlap removal condition comprises determining that a number of nets with overlap does not decrease by a minimum amount over a predetermined number of iterations.

5. A system, comprising:

a plurality of processors programmed to initiate executable operations comprising:

determining that nets of the circuit design comprise overlap;

unrouting the nets of the circuit design comprising overlap;

determining a congestion picture comprising costs of routing resources for the programmable integrated circuit, wherein the cost of a routing resource comprises a measure of historical congestion and a measure of current congestion, and wherein unrouted nets do not contribute to the measures of current congestion in the congestion picture;

concurrently routing a plurality of the unrouted nets, via the plurality of processors executing in parallel, according to the congestion picture; and storing routing information specifying routes for nets of the circuit design in the memory;

wherein:

the measure of current congestion is one plus a product of a share penalty and a number of contenders term;

the number of contenders term is zero for a routing resource not used as part of a net from the unrouting; and cost of a routing resource comprises the measure of current congestion multiplied by the historical congestion.

6. The system of claim 5, further comprising:

identifying a sequential overlap removal condition; and responsive to identifying the sequential overlap removal condition, performing a single-threaded routing technique;

wherein the sequential overlap removal condition comprises determining that a number of nets with overlap does not decrease by a minimum amount over a predetermined number of iterations.

* * * * *